USO11853909B1

United States Patent
O'Neil et al.

(10) Patent No.: US 11,853,909 B1
(45) Date of Patent: Dec. 26, 2023

(54) PREDICTION OF TRAVEL TIME AND DETERMINATION OF PREDICTION INTERVAL

(71) Applicant: GrubHub Holdings Inc., Chicago, IL (US)

(72) Inventors: Ryan J. O'Neil, Washington, DC (US); Sagar Sahasrabudhe, Chicago, IL (US); Gregory Danko, Oak Park, IL (US); Carolyn Mooney, Philadelphia, PA (US)

(73) Assignee: GRUBHUB HOLDINGS INC., Chicago, IL (US)

( * ) Notice: Subject to any disclaimer, the term of this patent is extended or adjusted under 35 U.S.C. 154(b) by 1020 days.

(21) Appl. No.: 16/413,228

(22) Filed: May 15, 2019

Related U.S. Application Data

(60) Provisional application No. 62/718,361, filed on Aug. 13, 2018.

(51) Int. Cl.

| | |
|---|---|
| *G06Q 10/04* | (2023.01) |
| *G06Q 10/08* | (2023.01) |
| *G01C 21/36* | (2006.01) |
| *G06N 20/00* | (2019.01) |
| *G06F 17/18* | (2006.01) |
| *G06N 5/04* | (2023.01) |
| *G06Q 10/06* | (2023.01) |
| *G06F 30/20* | (2020.01) |
| *G06Q 10/063* | (2023.01) |
| *G06Q 10/0835* | (2023.01) |

(Continued)

(52) U.S. Cl.
CPC .......... *G06N 5/04* (2013.01); *G01C 21/3691* (2013.01); *G01C 21/3697* (2013.01);
(Continued)

(58) Field of Classification Search
None
See application file for complete search history.

(56) References Cited

U.S. PATENT DOCUMENTS

| | | | |
|---|---|---|---|
| 6,269,351 B1 * | 7/2001 | Black ................. | G06N 3/082 706/14 |
| 9,639,908 B1 * | 5/2017 | Reiss ................. | G01S 5/0294 |

(Continued)

OTHER PUBLICATIONS

Durga Shrestha, Machine learning approaches for estimation of prediction interval for the model output, Science Direct, 2006 (Year: 2006).*

(Continued)

*Primary Examiner* — Resha Desai
*Assistant Examiner* — Ismail A Manejwala
(74) *Attorney, Agent, or Firm* — Baker Botts L.L.P.

(57) ABSTRACT

A computer-implemented method comprises receiving training data corresponding to a plurality of trips, the training data including at least a value for a set of attributes for each of the plurality of trips, the set of attributes including an indication of when in a week a trip is taken or in which of a plurality of meal-based time zones in a day the trip is taken, the training data including an actual travel time for each of the plurality of trips. The method further comprises creating and storing, in computer memory, a digital model that is configured to predict a travel time for a future trip based on the training data, the digital model including a set of parameters corresponding to the set of attributes, the digital model including a plurality of sets of values for the set of parameters. In addition, the method comprises receiving specific data for a specific trip, the specific data including an indication when in a week the specific trip will be taken or in which of a plurality of meal-based time zones of a day the specific trip will be taken; calculating a specific travel time for the specific trip using the digital model; determining a specific prediction interval for the specific travel time based on the plurality of sets of values for the set of parameters; and causing display of the specific travel time and the specific prediction interval.

21 Claims, 5 Drawing Sheets

(51) Int. Cl.
*G06Q 10/083* (2023.01)
*G06Q 10/0833* (2023.01)

(52) U.S. Cl.
CPC ............ *G06F 17/18* (2013.01); *G06F 30/20* (2020.01); *G06N 20/00* (2019.01); *G06Q 10/04* (2013.01); *G06Q 10/063* (2013.01); *G06Q 10/0833* (2013.01); *G06Q 10/0838* (2013.01); *G06Q 10/08355* (2013.01)

(56) References Cited

U.S. PATENT DOCUMENTS

| | | | |
|---|---|---|---|
| 2002/0188492 A1 | 12/2002 | Borton | |
| 2013/0253808 A1* | 9/2013 | He | G06Q 10/00 701/117 |
| 2014/0180576 A1* | 6/2014 | LaMarca | G08G 1/205 701/465 |
| 2015/0217820 A1* | 8/2015 | Papanikolaou | G06F 30/20 703/8 |
| 2015/0347676 A1* | 12/2015 | Zhao | G16B 30/10 702/20 |
| 2016/0202074 A1* | 7/2016 | Woodard | G06Q 10/047 701/465 |
| 2018/0204229 A1* | 7/2018 | Bateman | G06Q 10/08345 |

OTHER PUBLICATIONS

Sawtell-Rickson, "An Introduction to Food Delivery Time Prediction," internally dated Nov. 15, 2018, published by "towards data science" available at https://towardsdatascience.com/is-the-food-here-yet-f13a7bb0cd20, downloaded Jan. 22, 2021, 17 pages.

* cited by examiner

US 11,853,909 B1

PREDICTION OF TRAVEL TIME AND DETERMINATION OF PREDICTION INTERVAL

BENEFIT CLAIM

This application claims the benefit under 35 U.S.C. § 119(e) of U.S. provisional application 62/718,361, filed Aug. 13, 2018, the entire contents of which are hereby incorporated by reference for all purposes as if fully set forth herein. Applicant hereby rescinds any disclaimer of claim scope in the parent applications or the prosecution history thereof and advises the USPTO that the claims in this application may be broader than any claim in the parent applications.

FIELD OF THE DISCLOSURE

The present disclosure relates to the technical field of digital data analysis and transmission and specifically to the technical field of estimating travel time through real-time data collection, batch data processing, and machine learning to manage delivery services.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Efficient use of time in operating services for the delivery of goods or services is often a priority. While digital data generally travels in real time within a matter of seconds or minutes, the movement of physical items, such as a person, goods or a food delivery, may still take a significant amount of time. However, needs often arise to receive a physical item as soon as possible. For example, in on-demand food delivery, rapid service is essential to preserve freshness and temperature of orders. On the other hand, a delivery or transportation service may manage a large number of trips to move physical items. It is also generally an objective of such a service to make as many trips as possible while meeting arrival deadlines and to efficiently use delivery vehicles or personnel.

As information is recorded and digitized almost all the time, accumulated data regarding past activities or transactions can be mined to help determine how to move a physical item from one place to another. It will be helpful to transform all the relevant digital data into recommendations for effective communication of trip information and efficient trips.

DETAILED DESCRIPTION

Figure 1:
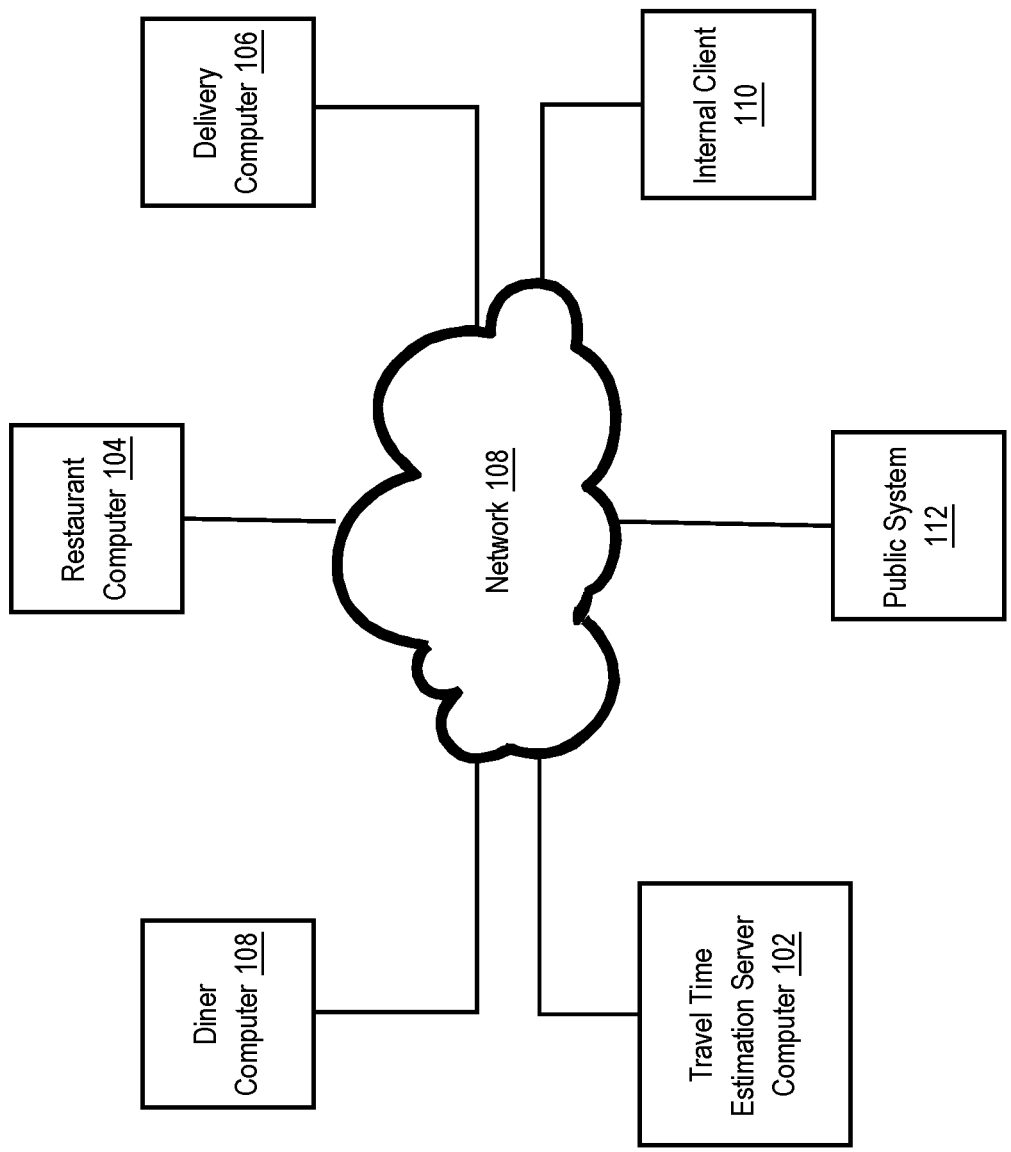
FIG. 1 illustrates an example networked computer system in which various embodiments may be practiced.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

1. General Overview

A computer-implemented travel time estimation server computer or server is disclosed for estimating a travel time for a trip and determining a prediction interval for the estimated travel time.

In some embodiments, the server is programmed to collect training data for building a digital model that predicts a travel time and provides a prediction interval. A digital "model" in this context refers to an electronic digitally stored set of executable instructions and data values, associated with one another, which are capable of receiving and responding to a programmatic or other digital call, invocation, or request for resolution based upon specified input values, to yield one or more stored or calculated output values that can serve as the basis of computer-implemented recommendations, output data displays, or machine control, among other things.

The training data can cover a plurality of data points corresponding a plurality of trips. Each trip is defined by at least a source, which is the initial location, and a destination, which is the final location. Each trip may have a variety of other attributes, such as when the trip is taken, what the route is, or what type of transportation is used for the trip. For example, for a trip for delivering a takeout meal, timing information that indicates whether today is a weekday or part of the weekend or whether the current time is around a typical meal time could be especially relevant to the road condition and the delivery service availability, which in turn affect the travel time.

Furthermore, in the training data, each trip is associated with an actual travel time, which is generally measured as the difference between the time when the transportation means arrives at the destination and the time when the transportation means departs from the source. The server can be configured to receive values for some of the attributes from various data sources and derive the values for the other attributes computationally, from additional data sources, or using default values for these attributes.

In some embodiments, the server is programmed to build the digital model that predicts a travel time and provides a prediction interval from the training data. The server is programmed to express the travel time as a function of a set of attributes of a trip and solve for the set of coefficients for the set of attributes using quantile regression. Specifically, the travel time estimate can be obtained from applying the set of coefficients corresponding to the conditional median or 50% quantile of the travel time given the set of attributes, and the prediction interval can be obtained from applying the other sets of coefficients corresponding to other quantiles of the travel time.

In other embodiments, an alternative objective function can be used for the regression analysis, such as the ordinary least squares instead of the least absolute deviation used in quantile regression In some embodiments, the server is programmed to receive a request for estimating the travel time for a specific trip. The request may include certain information about the specific trip in terms of values for some of the set of attributes, such as when the specific trip is to be taken, what a suggested route is, or what type of transportation is to be used for the specific trip. The server can also be programmed to determine some of that information or additional information about the specific trip. For example, the request may be related to delivering a takeout meal from a restaurant to a diner's residence. The request may include the address of the restaurant and that of the diner's residence. The request may also indicate that the order was recently placed or that the order is urgent. Based on this metadata, the server may be programmed to infer that the delivery should be completed soon as possible. Or, the request may explicitly include a data value specifying soonest possible delivery.

The server can be configured to determine that it is close to dinner time or rush hour on Friday, the shortest route might be through local roads instead of highways, and that it will have access to a bike or a car for this delivery. The server is then programmed to execute the digital model given the values for the attributes of the specific trip. The outcome of executing the digital model would include a travel time prediction and a prediction interval, such as that if the specific trip starts in 10 minutes, the travel time will be approximately 20 minutes plus or minus 5 minutes.

In some embodiments, the server is programmed to cause display of the predicted travel time and the prediction interval by the sender of the request. For example, when the request is related to delivering a meal, the request could come from a computing system associated with the restaurant preparing the meal, the diner who ordered the meal, a dispatcher who is to schedule a courier for the delivery, or the courier who is to deliver the meal. In response to the display of information related to the travel time estimate for the specific trip or the specific trip itself, the server may be programmed to receive a follow-up or an updated request and repeat the process discussed above.

The server produces many technical benefits. The digital model transforms relevant, multi-dimensional trip data into high-fidelity travel time information, which in turn improves operational efficiency. The digital model can further provide a prediction interval around the estimated travel time to allow for some flexibility without significantly sacrificing the quality of the travel time estimate. Furthermore, the high quality of the travel time estimate reduces the usage of computing resources from re-estimating the travel time, re-scheduling additional trips, or performing other related computational tasks. The high-quality of the travel time estimate also reduces usage of network bandwidth necessitated by repeated inquiries from computing devices associated with parties who are affected by the travel time estimate.

2. Example Computing Environments

FIG. 1 illustrates an example networked computer system in which various embodiments may be practiced. FIG. 1 is shown in simplified, schematic format for purposes of illustrating a clear example and other embodiments may include more, fewer, or different elements connected in various manners.

In some embodiments, the networked computer system comprises a travel time estimation server computer (server) 102, a diner computer 108, a restaurant computer 104, a delivery computer 106, an internal client 110, and a public system 112, which are communicatively coupled directly or indirectly via a network 118.

In some embodiments, the server 102 broadly represents one or more computers, virtual computing instances, and/or instances of a server-based application that is programmed or configured to host or execute functions including but not limited to building and executing a digital model for producing a travel time prediction and a prediction interval for a trip. The data used for the prediction may be related to various attributes of a trip, such as the time the trip is taken and specifically whether the time is associated with an event of interest, such as a meal, the route taken for the trip, and the means of transportation used for the trip. The prediction interval provides a range around a single travel time estimate for an increased confidence level. The server 102 can comprise a server farm, a cloud computing platform, a parallel computer, special-purpose hardware, or any other computing facility with sufficient computing power in data processing, data storage, and network communication for the above-described functions.

Each of the diner computer 108, restaurant computer 104, delivery computer 106, and internal client 110 may be programmed to submit a request to the server 102 for a travel time estimate for a certain trip and receive the travel time prediction or a prediction interval from the server 102. For example, the internal client 110, which may be integrated with the server 102, may be programmed to take the travel time estimate and determine whether or how to dispatch a delivery of a takeout meal. Each of these components and the public system 112 can also be configured to provide trip information or other relevant data for building or executing the digital model that estimates a travel time. For example, the delivery computer 106 may be configured to provide courier information or actual travel time for a trip, while the public system 112 may be configured to provide geographical maps or weather reports.

Each of the diner computer 108, restaurant computer 104, delivery computer 106, internal client 110, and the public system 112 may comprise computing facility with sufficient computing power in data processing, data storage, and network communication for the above-described functions. In some embodiments, each of these components can comprise a desktop computer, laptop computer, tablet computer, smartphone, or wearable device.

The networks 118 may be implemented by any medium or mechanism that provides for the exchange of data between the various elements of FIG. 1. Examples of network 118 include, without limitation, one or more of a cellular network, communicatively coupled with a data connection to the computing devices over a cellular antenna, a near-field communication (NFC) network, a Local Area Network (LAN), a Wide Area Network (WAN), the Internet, or a terrestrial or satellite link.

In some embodiments, the server 102 is programmed to collect training data for building a digital model for estimating the travel time for a trip from one or more of the diner computer 108, restaurant computer 104, delivery computer 106, internal client 110, or public system 112. The server 102 is then programmed to build the digital model from the training data. Subsequently, any of the diner computer 108, restaurant computer 104, delivery computer 106, and internal client 110, can be programmed to send a request to the server 102, including specific data regarding a specific trip, for a travel time prediction for the specific trip. The server 102 is programmed to apply the digital model to the specific data. The server 102 is programmed to further transmit the outcome of applying the digital model, such as a travel time prediction and a prediction interval around the travel time prediction, to the sender of the request.

3. Example Computer Components

Figure 2:
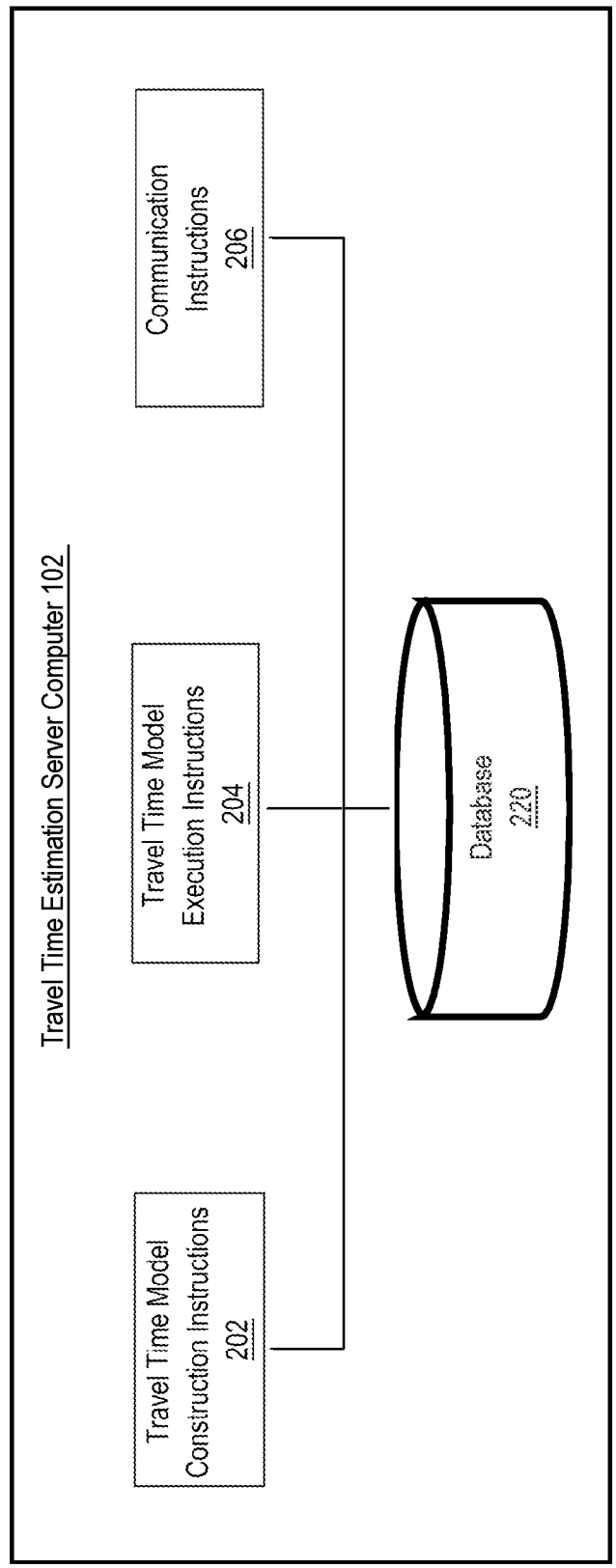
FIG. 2 illustrates example computer components of a travel time estimation server computer.

FIG. 2 illustrates example computer components of the travel time estimation server computer. FIG. 2 is shown in simplified, schematic format for purposes of illustrating a clear example and other embodiments may include more, fewer, or different elements connected in various manners. Each of the functional computer components can be implemented as software components, general or specific-purpose hardware components, firmware components, or any combination thereof. A storage computer component can be implemented using any of relational databases, object databases, flat file systems, or JSON stores. A storage computer component can be connected to the functional components locally or through the networks using programmatic calls, remote procedure call (RPC) facilities or a messaging bus. A computer component may or may not be self-contained. Depending upon implementation-specific or other considerations, the components may be centralized or distributed functionally or physically.

In some embodiments, the server 102 comprises a travel time model construction component 202 having travel time model construction instructions, a travel time model execution component 204 having travel time model execution instructions, a communication component 206 having communication instructions, and a database 220 having data produced by executing the instructions.

In some embodiments, the travel time model construction component 202 is programmed to build a digital model for estimating a travel time and producing a prediction interval that centers around an exact estimate but also includes nearby values for an increased confidence level. The travel time model construction component 202 can be programmed to capture a relationship between the travel time of a trip and various attributes of the trip from training data using quantile regression or other classification techniques. The relationship can be characterized at a fine granularity, such as by identifying different quantiles over the possible travel times given the attributes of a trip, to help determine appropriate prediction intervals.

In some embodiments, the travel time model execution component 204 is programmed to apply the digital model for estimating a travel time and producing a prediction interval in response to a specific request. The request may include information about a specific trip, such as the source and the destination. The request may also include a desired confidence level or other information describing the desired specificity or inclusiveness of the travel time estimation. The outcome of applying the digital model is then a travel time prediction and a corresponding prediction interval.

In some embodiments, the communication component 206 is programmed to communicate with other computing devices. The communication may include receiving training data, transmitting the digital model for predicting a travel time, receiving a request for estimating the travel time for a trip including specific data regarding the trip, or transmitting the outcome of applying the digital model to the specific data, such as a travel time prediction and a corresponding prediction interval.

In some embodiments, the database 220 is programmed or configured to manage relevant data structures and store relevant data for functions performed by the server 102. The data may be related to a trip in terms of a variety of attributes, such as the source, the destination, the route, the starting time, and the courier. The data can also be related to other factors affecting the travel time of a trip, such as the weather data, the geography data, the population data, or the cellphone reception data. In addition, the data can include the digital model and the outcomes of the digital model, such as the travel time predictions or the prediction intervals.

4. Building a Travel Time Model

In some embodiments, the server 102 is programmed or configured with data structures and/or database records that are arranged to collect training data for building a digital model for predicting the travel time for a trip. The training data can be internal data from past transactions or external data from user devices, sensors, or public data sources. Each data point in the training data corresponds to a trip includes values for a variety of attributes of a trip.

The attributes may be related to the source or the destination of the trip, such as the geographical region of the source or the destination. The attributes can be related to the route between the source and the destination, such as the length of or number of turns on the route. The attributes can be related to the means of transportation for traveling the route, such as by foot, bike, car, train, or airplane. The attributes can be related to the time of the trip. One example attribute indicates whether the time of the trip is on a weekday or during a weekend. Another example attribute indicates whether the time is one of the typical meal times, including breakfast, lunch, afternoon snack, dinner, and after-dinner snack, or whether the time is any other any other time.

In addition, the attributes may reflect various average or real-time conditions along the route, such as the muddiness or slipperiness of the road, the visibility of the road, or the amount of congestion or current maximum speed on the road. Each data point is also associated with an outcome of an actual travel time. The actual travel time may correspond to multiple estimates of the remaining travel time during the trip, including one estimate made soon after departure from the source and another estimate made prior to arrival at the destination. The actual travel time can then be taken as the difference between the two estimates. The estimate of the remaining travel time can be made based on a select route to the destination, such as one generated by the GraphHopper package, or a route determined via the Haversine formula. Alternatively, the actual travel time can be computed from the clock times obtained at the source and the destination. Furthermore, each trip can be considered as comprising many sub-trips or legs, each with a sub-source and a sub-destination along the path from the source to the destination. For each sub-trip, the sub-source and sub-destination can be randomly chosen, and values for the attributes of the sub-trip together with the actual travel time for the sub-trip can be recorded to increase the size of the training data.

In some embodiments, the server 102 is programmed to derive additional data from collected data. Given the source and the destination of a trip, the server 102 can be configured to determine the size of the population around the source or the destination from public data sources. The server 102 can be configured to further identify a route and a corresponding distance between the source and the destination using certain techniques known to one skilled in the art. Example packages implementing such techniques include the Open Source Routing Machine (OSRM) and GraphHopper.

Given the route, the server 102 can be configured to determine the number of traffic lights in the route, the hilliness of the route, or the strength of cellular reception for receiving directions along the route from public data sources. Given the date when the trip was taken, the server 102 can be configured to obtain weather data for the date from public data sources. Given the make and model of car and the age of the driver, the server 102 may be configured to determine the average speed of the car from historical internal data or other sources. All the collected data or derived data can be used to build the digital model to predict the travel time for a trip.

In some embodiments, the server 102 is programmed to build one or more digital models for predicting the travel time for a trip using the training data. A digital model can be built covering all the training data or with respect to one or more attributes separately or in combination. For example, the server 102 can be configured to build a digital model for each pair of geographical regions corresponding to the source and the destination. Therefore, the digital model will be built from all the data points in the training data having a particular pair of values for the geographical region of the source and the geographical region of the destination. When only relatively short trips are allowed through the requirement that the source and the destination are in the same geographical region, the digital model can be built from all data points in the training data having a particular value for the graphical region of the source and that of the destination. Furthermore, the server 102 can be configured to first cluster neighboring geographical regions into a so-called market and build a digital model at the market level. The clustering can be performed by constructing a graph where each node represents the centroid of a geographical region and two nodes are connected by an edge when the distance between the corresponding centroids are below a certain threshold. Clusters can then be constructed by finding connected components within the graph.

In some embodiments, the server 102 is programmed to build a digital model for predicting the travel time for a trip using certain discrete or statistical classification techniques known to someone skilled in the art, such as regression analysis, clustering, decision trees or random forests, or neural networks. In particular, the server 102 can be programmed to build the digital model using quantile regression, which tends to avoid unwanted noise caused by outliers. The travel time is formulated as a random variable that is a function of a set of attributes of a trip, as discussed above. The travel time can be related to the set attributes through a corresponding set of coefficients, which can be taken as a set of parameters of the digital model. Using the data points in the training data as samples, the set of parameter values that estimates the conditional median of the travel time, which represents the 50% quantile, can be determined by finding the least absolute deviation (LAD) or minimizing a sum of absolute errors.

The set of parameter values that estimates another value of the travel time that represents another quantile can be determined by minimizing an asymmetrically weighted sum of absolute errors. Example packages implementing quantile regression include the StatsModel package. The server 102 is generally programmed to identify a plurality of parameter values for a plurality of quantiles, such as a total of 17 equal-sized quantiles from the 10% quantile to the 90% quantile with 5% increments. Each equal-sized (e.g., 5%) quantile covers about the same number of travel time estimates and could readily be used to provide a prediction interval corresponding to a desired range.

In some embodiments, the server 102 is programmed to update the training data and rebuild the digital model as more trips are taken. The digital model can be rebuilt as soon as new data points become available, according to a specific schedule, or upon a specific request.

5. Predicting Travel Time and Determining Prediction Interval

In some embodiments, the server 102 is programmed to receive a request for estimating the travel time for a specific trip. The request may include values for at least some attributes of the specific trip, such as the source, the destination, whether the specific trip is to take place on a weekday or over a weekend, whether the specific trip is to take place around one of the meal times, or the type of transportation to complete the specific trip. The request may originate from a variety of scenarios. Multiple trips or legs can be associated with the transportation or delivery of one or more items. For example, starting from the current location, a delivery vehicle might need to travel to the location of the sender of the first item, the location of the sender of the second item, the location of the recipient of the first item, and the location of the recipient of the second item, in that order.

Prior to or during delivery of an item, the request for a travel time estimate to determine when the item might arrive may come from a computing device associated with the sender, the recipient, the courier, or the party that facilitates the ordering of the item. In organizing delivery services, the request for a travel time estimate might come from a computer system associated with the organizer to determine whether to deliver an item or how to dispatch the couriers or other delivery vehicles. For example, the organizer might want to limit delivery services to locations that can be reached within a certain amount of time from the initial location, or equivalently locations within a travel time isochrone originating from the initial location corresponding to the certain amount of time. The organizer might want to set deadlines for when suppliers need to have their items ready for delivery from the supplier sites. In addition, the organizer might want to determine to which courier to assign a delivery depending on when the courier's current or future delivery is complete.

In some embodiments, the server 102 is programmed to select an appropriate digital model for the specific trip and apply that digital model to estimate the travel time for the specific trip. The outcome of the application may include a travel time prediction and a prediction interval. When the digital model is implemented using quantile regression, the digital model may correspond to a list of sets of coefficients or parameter values corresponding to a list of quantiles, such as the 30%, 40%, 50%, 60%, and 70% quantiles. Given the values for the attributes, each of these sets of parameter values can be used to generate a travel time estimate that corresponds to a specific quantile out of all the possible travel times given these attributes. The travel time corresponding to the median or the 50% quantile can be taken as the single or main travel time estimate. The boundary of the prediction interval can be taken as the travel time corresponding to the 30% quantile and the travel time corresponding to the 70% quantile, for example, which covers about 40% of all the possible travel times and thus represents a relatively large confidence level. The boundary can alternatively be taken as the travel time corresponding to the 40% quantile and the travel time corresponding to the 60% quantile, for example, which covers about 20% of all the possible travel times and thus represents a relatively small confidence level. The desired confidence interval or desired range for the prediction interval may have been included in the request received by the server 102. The size of the prediction interval can also be automatically determined based on various factors, such as past requests for specific prediction intervals or the completeness of the trip information included in the present request.

In some embodiments, the server 102 is programmed to transmit the outcome of applying the digital model to a certain computing device in response to the original request for a travel time estimate. The server 102 can be programmed to subsequently re-apply the digital model for the same request or similar requests based on newly received real-time data. Updated traffic condition may become available periodically and trigger a re-application of the digital model to an updated request. The server 102 may also be configured to continuously receive data regarding the current location of a courier from a computing device associated with the courier and repeatedly re-apply the digital model to an updated request for estimating the remaining travel time.

In response to a courier's failure to complete the trip within the prediction interval around a certain travel time estimate, the server 102 may be configured to provide a broader prediction interval for a subsequent trip along the same route or by the same courier. In response to a follow-up request to reduce the travel time to be shorter than the travel time estimate, the server 102 may be configured to find a shorter route or a more efficient courier and re-apply the digital model accordingly.

In some embodiments, the server 102 is programmed to transmit the digital model to another computing device, which can then apply the digital model on certain data related to a certain trip to estimate a travel time for the certain trip and determine a prediction interval around the estimated travel time.

6. Example Computer-Implemented Processes

Figure 3:
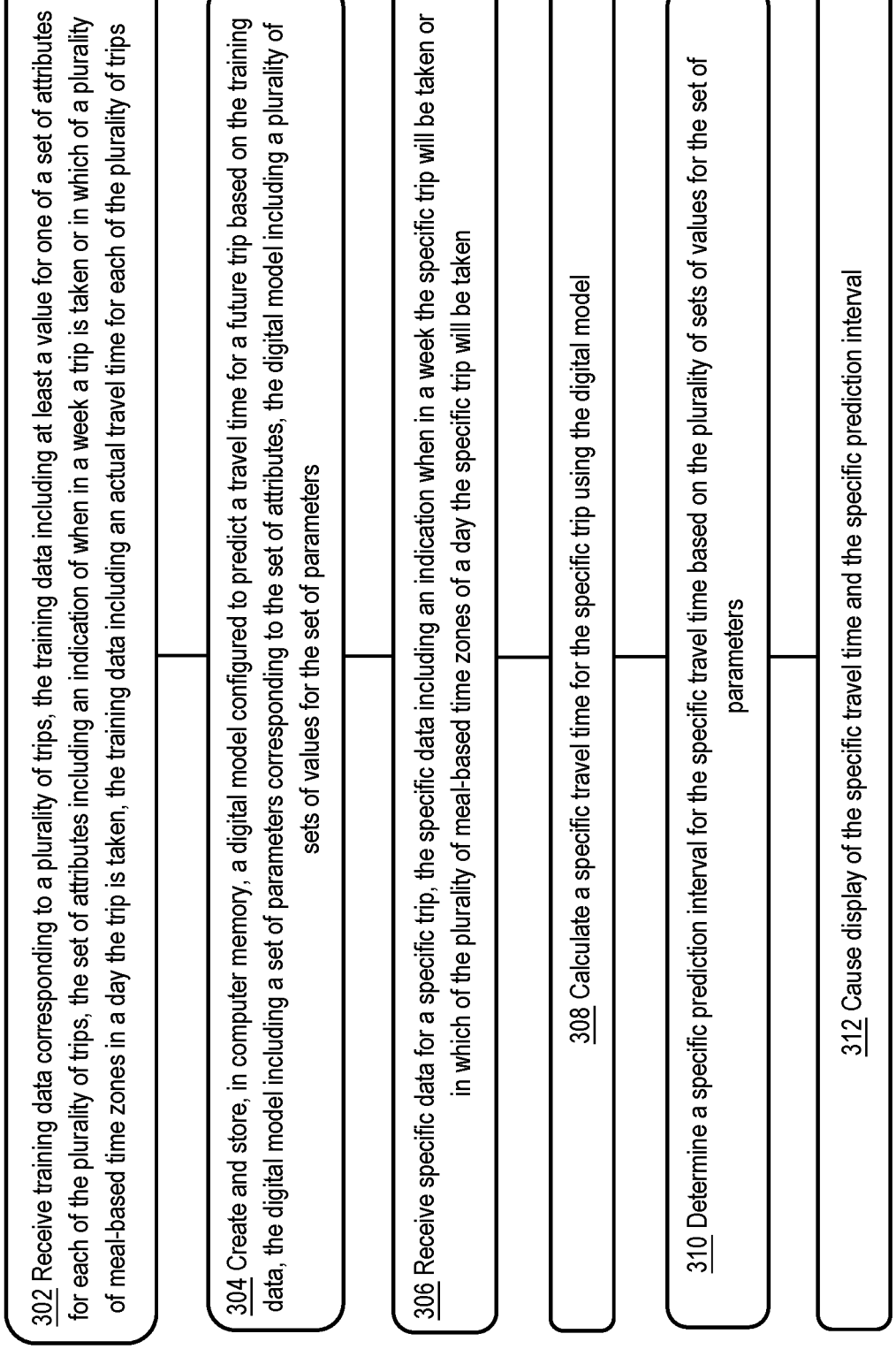
FIG. 3 illustrates an example computer-implemented process performed by a travel time estimation server computer.

FIG. 3 illustrates an example computer-implemented process performed by a travel time estimation server computer.

In some embodiments, in step 302, the server 102 is programmed or configured to receive training data corresponding to a plurality of trips, as further discussed in Section 4 above. The training data includes at least a value for one of a set of attributes for each of the plurality of trips. The set of attributes includes an indication of when in a week a trip is taken or in which of a plurality of meal-based time zones in a day the trip is taken. For example, the trip could be taken on a weekday and around dinner time. The set of attributes could also be related to the source, the destination, or the route of the trip, such as geographical or demographical properties, or the means of transportation for the trip, such as vehicle characteristics or driver characteristics. Furthermore, the training data includes an actual travel time for each of the plurality of trips.

In some embodiments, in step 304, the server 102 is programmed or configured to build a digital model configured to predict a travel time for a future trip based on the training data, as further discussed in Section 4 above. The server 102 can be programmed to identify a relationship between the travel time and the set of attributes of a trip. The digital model then includes a set of parameters corresponding to coefficients for the set of attributes, which can be solved for using quantile regression or other classification techniques. In certain embodiments, the server 102 can be configured to set up the relationship as a linear formula involving the travel time and solve for the coefficients corresponding to a conditional median or 50% quantile of the travel time given the set of attributes. The server 102 can be configured to further solve for the coefficients corresponding to other quantiles for establishing different prediction intervals, thereby attaching a plurality of sets of parameters values to the digital model.

In some embodiments, in step 306, the server 102 is programmed or configured to receive a request including specific data for a specific trip for a travel time estimate, as further discussed in Section 5 above. The specific data may include an indication of when in a week the specific trip will be taken or in which of the plurality of meal-based time zones of a day the specific trip will be taken. The specific data can also include values for the other attributes of a trip. In addition, the request can indicate a desired range for the travel time estimate.

In some embodiments, in step 308, the server 102 is programmed or configured to calculate a specific travel time for the specific trip using the digital model, as further discussed in Section 5 above. By applying the set of coefficients corresponding to the 50% quantile to the specific data, the server 102 is programmed to predict a travel time for the specific trip.

In some embodiments, in step 310, the server 102 is programmed or configured to determine a specific prediction interval for the specific travel time based on the plurality of sets of values for the set of parameters. For example, when the request indicates a desired 20% range for the travel time estimate, the server 102 can be configured to apply the set of coefficients corresponding to the 40% quantile and the 60% quantile to obtain a lower bound and an upper bound for the travel time estimate, which defines a prediction interval covering about 20% of the possible travel times given the attributes of a trip. When the request does not indicate any desired range for the travel time estimate, the server 102 can be configured to generate no prediction interval or a prediction interval having a default size, such as covering 10% of the possible travel times around the travel time prediction corresponding to the 50% quantile.

In some embodiments, in step 312, the server 102 is programmed or configured to cause display of the specific travel time and the specific prediction interval, as further discussed in Section 5 above. The server 102 can be configured to transmit the specific travel time and the specific prediction interval to a display device or to the sender of the request, which might then perform downstream processing, such as actually arranging for the trip based on the travel time estimate. Thus, in some embodiments, the process of FIG. 3 may result in transmitting new or updated driving routes, instructions, order pickup instructions, and/or order delivery instructions to a driver, courier or other individual or vehicle, using a mobile computing device of the driver, courier or vehicle, to result in different routing for delivery of goods or services.

7. Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 4:
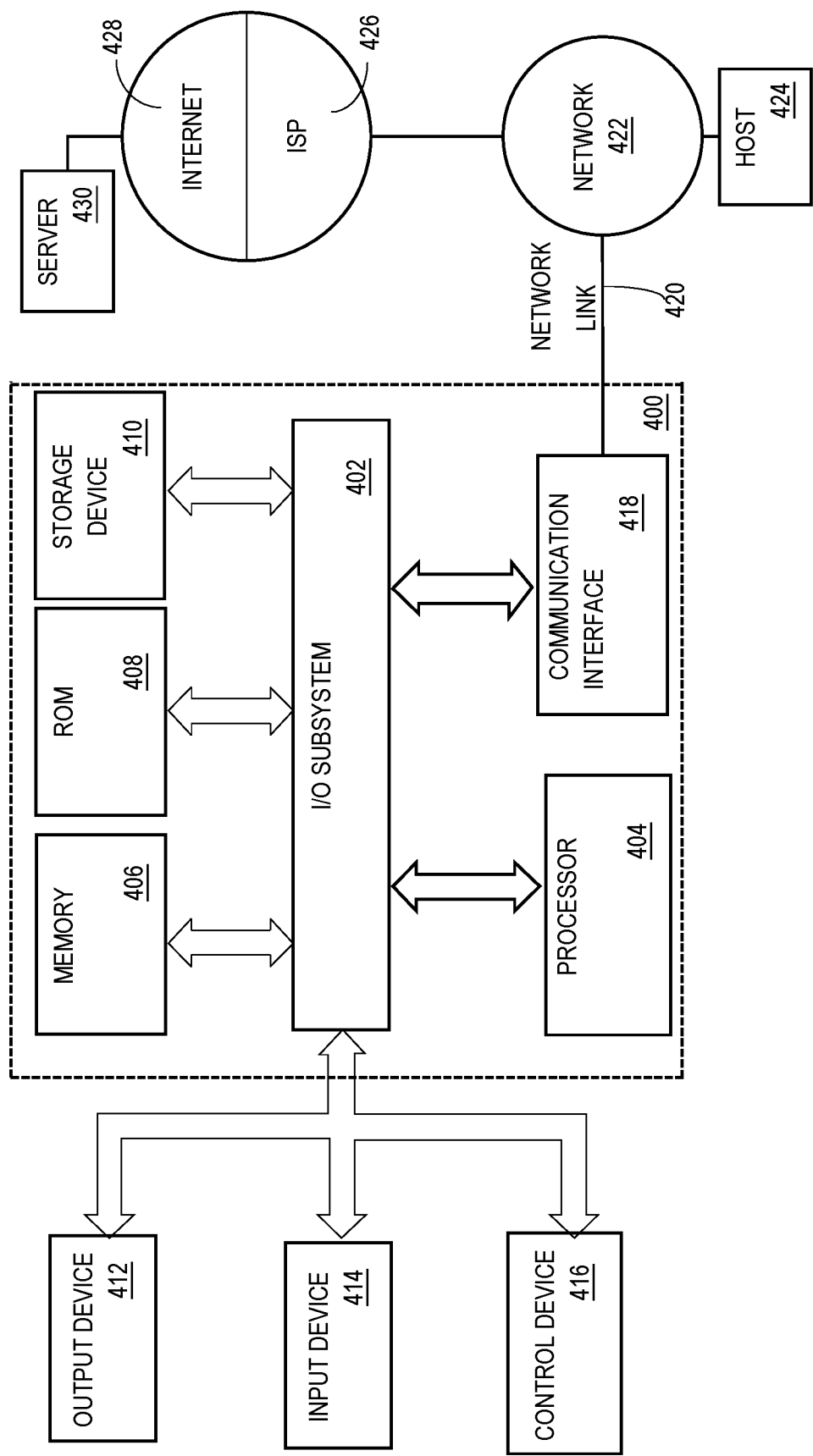
FIG. 4 is a block diagram that illustrates a computer system upon which an embodiment of the invention may be implemented.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

Cloud-Based Service Overview

Figure 5:
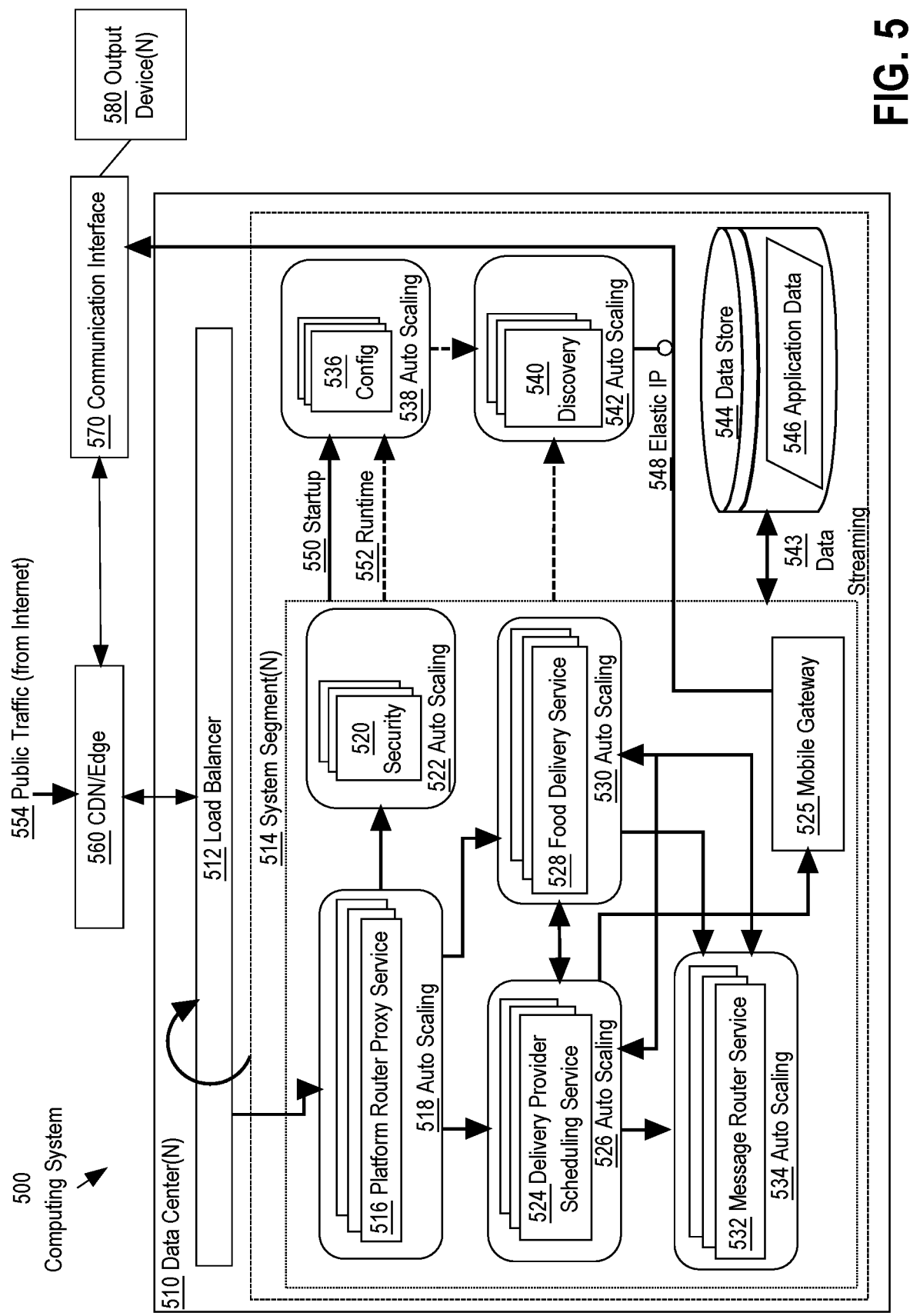
FIG. 5 is a block diagram that illustrates a cloud-based architecture upon which an embodiment of the invention may be implemented.

FIG. 5 is an example block diagram illustrating one or more embodiments of a cloud-based computing environment including one or more electronic components in which aspects of the present disclosure may be implemented. The electronic components illustrated in FIG. 5 are implemented in computer hardware, software, or a combination of hardware and software. In the embodiment of FIG. 5, computing system 500 includes N data centers, where N is a positive integer. In some embodiments, each data center 510 is implemented as a group of AMAZON EC2 nodes. Each data center 510 includes a load balancer 512 and a plurality of server computers. In an embodiment, load balancer 512 is an elastic load balancer that automatically distributes incoming application traffic and scales resources to meet traffic demands. The server computers of a data center 510 are communicatively coupled to one another by the load balancer 512.

The load balancer 512 of each data center 510 is communicatively coupled to the Internet by an edge device 560. Edge device 560 is a content delivery network (CDN) or an edge computer, in an embodiment. In other embodiments, edge device 560 is a router, a network switch, or other electronic device or service that performs the function of logically connecting separate networks. Public traffic 554 is routed to load balancer 512 through edge device 560 and to a particular system segment of data center 510 through load balancer 512. Public traffic 554 includes, for example, search queries and electronic food orders that are issued via a food ordering web site or a mobile app of a client device.

Any number N of output devices 580 may be communicatively coupled to data center 510 at any given time, via a communication interface 570 or a mobile gateway 525. Examples of output devices 580 are delivery provider computing devices 140 and display devices 130, described above. An output device 580 may be a delivery provider's mobile electronic device or an in-dash digital display of a delivery provider's vehicle, for example.

Communication interface 570 is a network interface, which includes or is coupled to, for example, a Wi-Fi access point or a cellular transceiver. Communication interface 570 connects edge device 560 with a mobile electronic device. In an embodiment, electronic messages indicating work opportunities, which are generated by a delivery provider scheduling service 524, and electronic messages indicating acceptance or rejection of those work opportunities by a delivery provider, are exchanged between output device 580 and delivery provider scheduling service 524 via mobile gateway 525. In an embodiment, mobile gateway 525 provides a secure electronic communication connection between delivery provider scheduling service 524 and output device 580.

Data center 510 includes N system segments 514. A system segment 514 is a logical organization of computer components that implements a portion of the functionality of computing system 100, described above. In an embodiment, system segment 514 is implemented using AMAZON WEB SERVICE (AWS). FIG. 5 illustrates one system segment in detail, namely, a delivery system segment. In an embodiment, other system segments include a product ordering system segment and a food provider system segment, which are arranged in a similar manner as system segment 514.

System segment 514 includes a combination of automatically scalable cloud-based application-specific services and automatically scalable cloud-based support services that support the application-specific services. In FIG. 5, the application-specific services are delivery provider scheduling service 524 and food delivery service 528, while the supporting services are platform router proxy service 516, security service 520, message router service 532, config service 538, and discovery service 540. Delivery provider scheduling service 524 is a web service-based implementation of delivery provider scheduling system 104, described above. Food delivery service 528 is a web service-based implementation of food delivery system 120, described above.

Platform router proxy service 516 handles network communications between the Internet and delivery system segment 514. Platform router proxy service 516 determines how to route network communications between different services and the Internet. Platform router proxy service 516 uses a mapping of server network addresses (endpoints) to the software-based services that are located at those endpoints, in order to determine which server(s) in data center 510 are running requested services.

Security service 520 authenticates requests for data made by different user accounts. Security service 520 verifies that the requesting account is authorized to request data from a particular service as identified by its endpoint. To do this, security service 520 matches the access level requested by an account to the corresponding requirement within the security policy implemented for the requested service.

Message router service 532 manages messaging queues between the different services of system segment 514. Config service 538 maintains the startup 550 and runtime 552 configurations for each of the services, including, for example, the type of service, the size of the instance to be used to run the service, threshold wait times for receiving a response before terminating a request, bucket sizes and batch sizes to use for certain calculations, etc. The configuration for any particular service changes dynamically as virtual machine instances are continuously brought up and down to accommodate load changes.

Discovery service 540 is used by platform router proxy service 516 to find the actual network addresses of other services. When a new instance of a service starts up, the new instance notifies discovery service 540 of its actual network address, for example its Internet Protocol (IP) address. When an instance shuts down, the instance notifies discovery service 540 that the service is no longer provided by the instance with that network address. Discovery service 540 uses elastic IP addresses 548 to publish data within a service outside of the instance within which the service is running. Elastic IP addresses 548 make data produced by an instance of a service accessible to, for example, the public Internet.

Each of the services shown in FIG. 5 has a respective auto scaling component 518, 522, 526, 530, 534, 538, 542. The auto scaling component dynamically controls the number of virtual machine instances that are used to support a particular service. In one embodiment, the services shown in FIG. 5 are organized using AMAZON EC2 AutoScaling groups such that the number of virtual machine instances running for a particular service is scaled up and down to match the demand for the service as the demand changes over time. Auto scaling may change the number of virtual machines assigned to a service by changing the config settings for that service. For example, during the Sunday dinner hour, new virtual machine instances may be launched to handle the increased number of requests and the resulting increased computational load on the services 524, 528. If the computational load exceeds a threshold, the auto scaling component may dedicate an entire server to the affected service.

System segment 514 also includes its own data store 544. Data store 544 stores application data 546, which is data collected and generated by delivery provider scheduling service 524 and food delivery service 528. In an embodiment, application data 546 is transferred to data store 544 using data streaming 543. In an embodiment, data streaming 543 is implemented using an AMAZON KINESIS data firehose. Data store 544 is implemented as a searchable database or data warehouse, for example. Data stored in data store 544 is used to build predictive models and generate recommendations as described above.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A computer-implemented method comprising:
   receiving training data corresponding to a plurality of trips, the training data including at least a value for one of a set of attributes for each of the plurality of trips, the set of attributes including an indication of when in a week a trip is taken or in which of a plurality of meal-based time zones in a day the trip is taken, the training data including an actual travel time for each of the plurality of trips;
   creating and storing, in computer memory, a digital model that is configured to predict a travel time for a future trip based on the training data, the digital model being created based on a plurality of sets of values of a set of parameters corresponding to the set of attributes, wherein the plurality of sets of values for the set of parameters have been determined by implementing quantile regression based on a plurality of actual travel times, wherein each value of a corresponding parameter corresponds to a specific quantile among a plurality of different quantiles, corresponding to the plurality of the actual travel times based on corresponding attributes;
   receiving a request with specific data for a specific trip prior to a delivery, the specific data of the request including a range between two different quantiles determined by the quantile regression for a travel time estimate, and an indication when in a week the specific trip will be taken or in which of the plurality of meal-based time zones of a day the specific trip will be taken;
   calculating a specific travel time for the specific trip using the digital model;
   determining a specific prediction interval for the specific travel time using the digital model based on the plurality of sets of values for the set of parameters by applying the values for the set of parameters corresponding to the range between the two different quantiles among the plurality of different quantiles determined by the quantile regression to obtain a lower bound and an upper bound for the travel time estimate, wherein the lower bound and the upper bound for the travel time estimate are obtained from a set of 30%, 40%, 50%, 60%, and 70% quantiles among the plurality of different quantiles;
   causing display of the specific travel time and the specific prediction interval;
   in response to a courier's failure to complete a route of the specific trip within the specific prediction interval around the specific travel time, providing a broader prediction interval for a subsequent trip along a same route using the digital model, wherein providing the broader prediction interval comprises increasing the lower bound and the upper bound for the travel time estimate by one quantile each from the set of 30%, 40%, 50%, 60%, and 70% quantiles among the plurality of different quantiles, wherein the increasing the lower bound and the upper bound for the travel time estimate corresponds to a higher confidence level than the specific prediction interval around the specific travel time;
   wherein the method is performed by one or more computing devices.

2. The method of claim 1, a first of the plurality of sets of values corresponding to a conditional median of a predicted travel time.

3. The method of claim 2, the calculating being based on the first of the plurality of sets of values.

4. The method of claim 2, wherein the determining being based on a second set of values corresponding to a percentile of the predicted travel time that is greater than 50% and a third set of values corresponding to a percentile of the predicted travel time that is less than 50%.

5. The method of claim 1, the set of attributes further including a route for a trip, a type of transportation for a trip, a geographical region in which the trip is located, or a weather condition when a trip is taken.

6. The method of claim 1, the digital model being specific to a geographical region in which a source of a trip is located, a destination of the trip is located, or the source and the destination are both located.

7. The method of claim 1, the plurality of meal-based time zones includes breakfast, lunch, afternoon snack, dinner, after-dinner snack, and other.

8. The method of claim 1, further comprising:
   receiving the specific data in the request from a computing device associated with a sender or a recipient of an item prior to or during the delivery of the item;
   determining an estimated arrival time for the item based on specific travel time;
   causing display of the estimated arrival time by the computing device.

9. The method of claim 1, further comprising assigning the specific trip to one of a plurality of couriers based on the specific travel time and schedules of the plurality of couriers.

10. The method of claim 1, further comprising:
    receiving a request to find a courier for the specific trip;
    rejecting the request when the specific travel time exceeds a specific threshold.

11. The method of claim 1, further comprising:
    receiving a notification that an actual travel time for the specific trip lies outside the prediction interval;
    receiving certain data for a certain trip, the certain data including at least a source of the certain trip that is identical to a source of the specific trip, a destination of the certain trip that is identical to a destination of the specific trip;

calculating a certain travel time for the certain trip using the digital model;

determining a certain prediction interval for the certain travel time based on the plurality of sets of values for the set of parameters, the certain prediction interval being larger than the specific prediction interval.

12. The method of claim 1, wherein the travel times comprise values of a random variable as a function of the set of attributes, the method further comprising:

determining each quantile among the plurality of different quantiles by minimizing an asymmetrically weighted sum of absolute errors of travel times or the training data to estimate another value of the travel times that represents another quantile.

13. The method of claim 1, wherein the travel times comprise values of a random variable as a function of the set of attributes, the method further comprising:

determining each quantile among the plurality of different quantiles by minimizing an asymmetrically weighted sum of absolute errors of travel times or the training data to estimate another value of the travel times that represents another quantile.

14. One or more non-transitory storage media storing instructions which, when executed by one or more processors cause the one or more processors computing devices to execute:

obtaining a digital model configured to predict a travel time for a future trip, the digital model corresponding to a set of attributes of a trip, the set of attributes including an indication of when in a week a trip is taken or in which of a plurality of meal-based time zones in a day the trip is taken, the digital model being created based on a plurality of sets of values of a set of parameters corresponding to the set of attributes, wherein the plurality of sets of values for the set of parameters have been determined by implementing quantile regression based on a plurality of actual travel times, wherein each value of a corresponding parameter corresponds to a specific quantile among a plurality of different quantiles, corresponding to the plurality of the actual travel times based on corresponding attributes;

receiving a request with specific data for a specific trip prior to a delivery, the specific data of the request including a range between two different quantiles determined by the quantile regression for a travel time estimate, and an indication when in a week the specific trip will be taken or in which of the plurality of meal-based time zones of a day the specific trip will be taken;

calculating a specific travel time for the specific trip using the digital model;

determining a specific prediction interval for the specific travel time based on the plurality of sets of values for the set of parameters by applying the values for the set of parameters corresponding to the range between the two different quantiles among the plurality of different quantiles determined by the quantile regression to obtain a lower bound and an upper bound for the travel time estimate, wherein the lower bound and the upper bound for the travel time estimate are obtained from a set of 30%, 40%, 50%, 60%, and 70% quantiles among the plurality of different quantiles;

causing display of the specific travel time and the specific prediction interval;

in response to a courier's failure to complete a route of the specific trip within the specific prediction interval around the specific travel time, providing a broader prediction interval for a subsequent trip along a same route using the digital model, wherein providing the broader prediction interval comprises increasing the lower bound and the upper bound for the travel time estimate by one quantile each from the set of 30%, 40%, 50%, 60%, and 70% quantiles among the plurality of different quantiles, wherein the increasing the lower bound and the upper bound for the travel time estimate corresponds to a higher confidence level than the specific prediction interval around the specific travel time.

15. The one or more non-transitory storage media of claim 14, a first of the plurality of sets of values corresponding to a conditional median of a predicted travel time.

16. The one or more non-transitory storage media of claim 14, the set of attributes further including a route for a trip, a type of transportation for a trip, a geographical region in which the trip is located, or a weather condition when a trip is taken.

17. The one or more non-transitory storage media of claim 14, the plurality of meal-based time zones includes breakfast, lunch, afternoon snack, dinner, after-dinner snack, and other.

18. The one or more non-transitory storage media of claim 14, further comprising sequences of instructions which when executed cause the one or more processors to perform:

receiving a request to find a courier for the specific trip;

rejecting the request when the specific travel time exceeds a specific threshold.

19. The one or more non-transitory storage media of claim 14, further comprising sequences of instructions which when executed cause the one or more processors to perform:

receiving a notification that an actual travel time for the specific trip lies outside the prediction interval;

receiving certain data for a certain trip, the certain data including at least a source of the certain trip that is identical to a source of the specific trip, a destination of the certain trip that is identical to a destination of the specific trip;

calculating a certain travel time for the certain trip using the digital model;

determining a certain prediction interval for the certain travel time based on the plurality of sets of values for the set of parameters, the certain prediction interval being larger than the specific prediction interval.

20. The one or more non-transitory storage media of claim 14, wherein the travel times comprise values of a random variable as a function of the set of attributes, further comprising sequences of instructions which when executed cause the one or more processors to perform:

determining each quantile among the plurality of different quantiles by minimizing an asymmetrically weighted sum of absolute errors of travel times or training data to estimate another value of the travel times that represents another quantile.

21. The one or more non-transitory storage media of claim 14, wherein the travel times comprise values of a random variable as a function of the set of attributes, further comprising sequences of instructions which when executed cause the one or more processors to perform:

determining each quantile among the plurality of different quantiles by minimizing an asymmetrically weighted sum of absolute errors of travel times or the training data to estimate another value of the travel times that represents another quantile.

* * * * *